United States Patent [19]

Chiou

[11] Patent Number: 5,664,622
[45] Date of Patent: Sep. 9, 1997

[54] HEAT SINK WITH DEFORMABLE HANGERS FOR MOUNTING

[76] Inventor: Ming Der Chiou, 4F., No. 36, Yu Min Rd., Tu Cheng City, Taipei, Taiwan

[21] Appl. No.: 655,436

[22] Filed: May 30, 1996

[51] Int. Cl.[6] .................................. H05K 7/20
[52] U.S. Cl. .................. 165/80.2; 165/80.3; 165/185; 257/719
[58] Field of Search .................. 165/80.3, 185, 165/80.2; 361/697, 704; 257/718, 719

[56] References Cited

U.S. PATENT DOCUMENTS

| 5,208,731 | 5/1993 | Blomquist | 361/386 |
|---|---|---|---|
| 5,386,338 | 1/1995 | Jordan et al. | 361/704 |
| 5,509,465 | 4/1996 | Lai | 165/80.3 |
| 5,519,574 | 5/1996 | Kodama et al. | 361/697 |
| 5,521,439 | 5/1996 | Casati et al. | 257/718 |

*Primary Examiner*—Allen J. Flanigan
*Attorney, Agent, or Firm*—Bacon & Thomas

[57] ABSTRACT

A heat sink has two hangers at two opposite sides for mounting, wherein the hangers are respectively made from a metal wire that can be bent into the desired shape for hanging on the ribs of any of a variety of CPU holders.

1 Claim, 4 Drawing Sheets

HEAT SINK WITH DEFORMABLE HANGERS FOR MOUNTING

BACKGROUND OF THE INVENTION

The present invention relates to heat sinks adapted for use with a CPU for the dissipation of heat, and relates more particularly to such a heat sink which has two hangers at two opposite sides that can be bent into the desired shape to fit any of a variety of CPU holders of different sizes.

Because the CPU of a computer system is an important part and produces heat during its operation, heat must be quickly carried away from the CPU to prevent the occurrence of damage to it. Various heat sinks have been developed for this purpose. These heat sinks may be used independently, or with a fan. FIG. 1 shows a conventional heat sink installed in a CPU holder. As illustrated, the heat sink 1 has two hangers 11, 12 at two opposite sides respectively hung on respective ribs 131, 132 at two opposite sides of the heat sink 13. Because the hangers 11, 12 are respectively made from rigid metal, they cannot be bent into the desired shape to fit any of a variety of CPU holders.

SUMMARY OF THE INVENTION

According to the present invention, the heat sink has two hangers at two opposite sides for mounting, wherein the hangers are respectively made from a metal wire that can be bent into the desired shape for hanging on the ribs of any of a variety of CPU holders having different heights.

DETAILED DESCRIPTION OF THE PREFERRED EMBODIMENT

Figure 1:
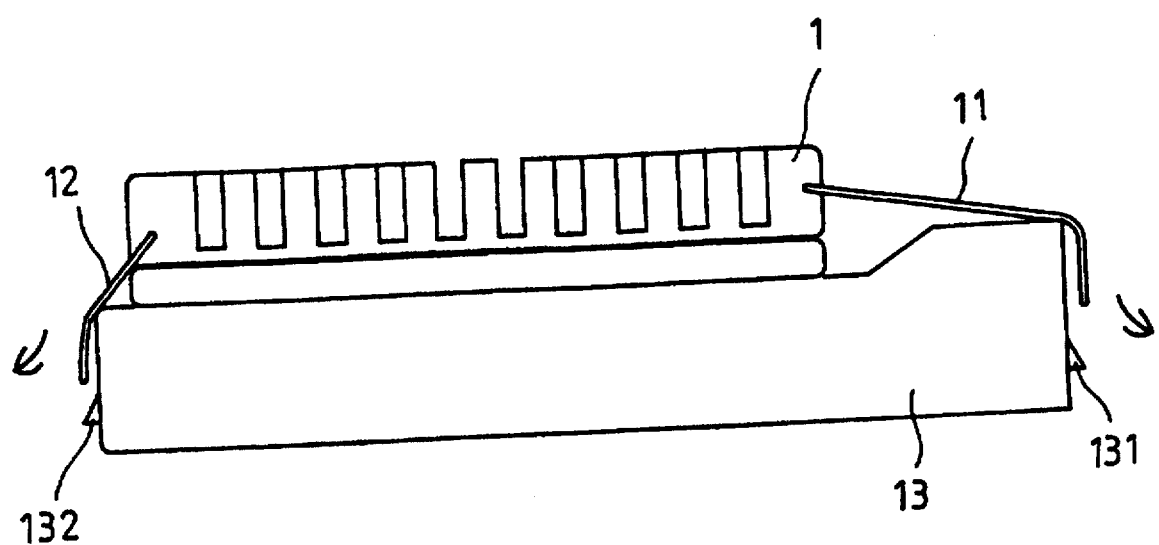
FIG. 1 shows a heat sink fastened to a CPU holder according to the prior art.
Figure 2:
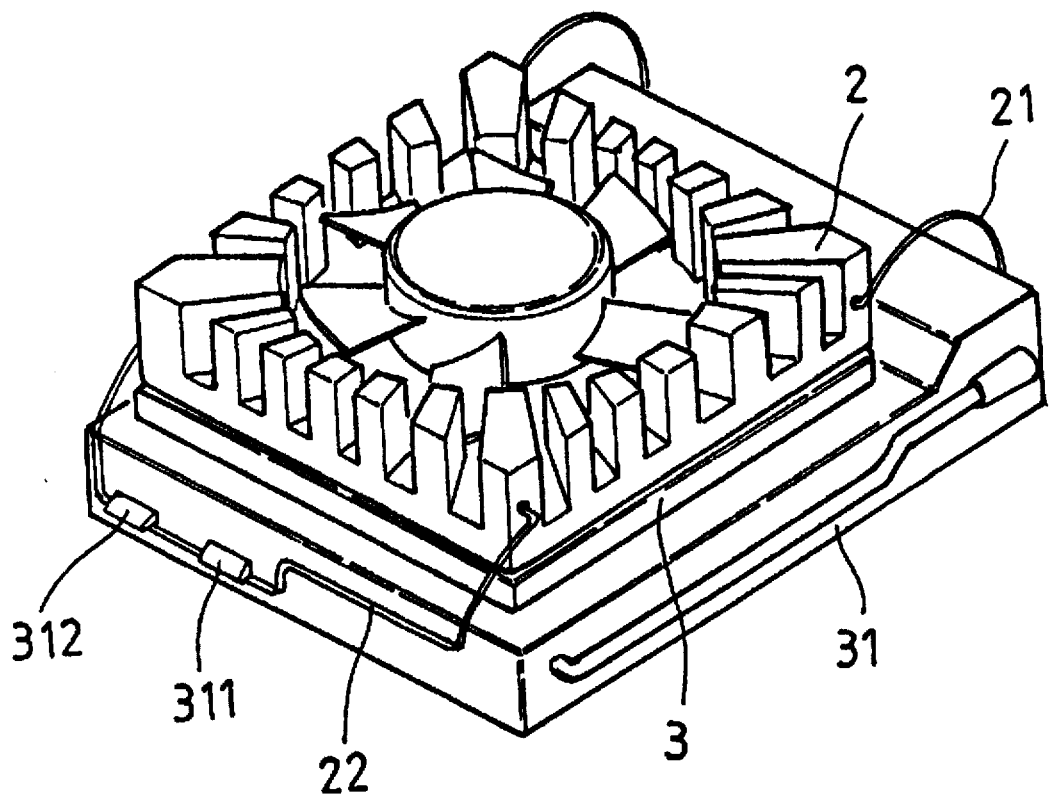
FIG. 2 is an elevational view showing the heat sink of the present invention mounted on a CPU holder having a shorter height.
Figure 3:
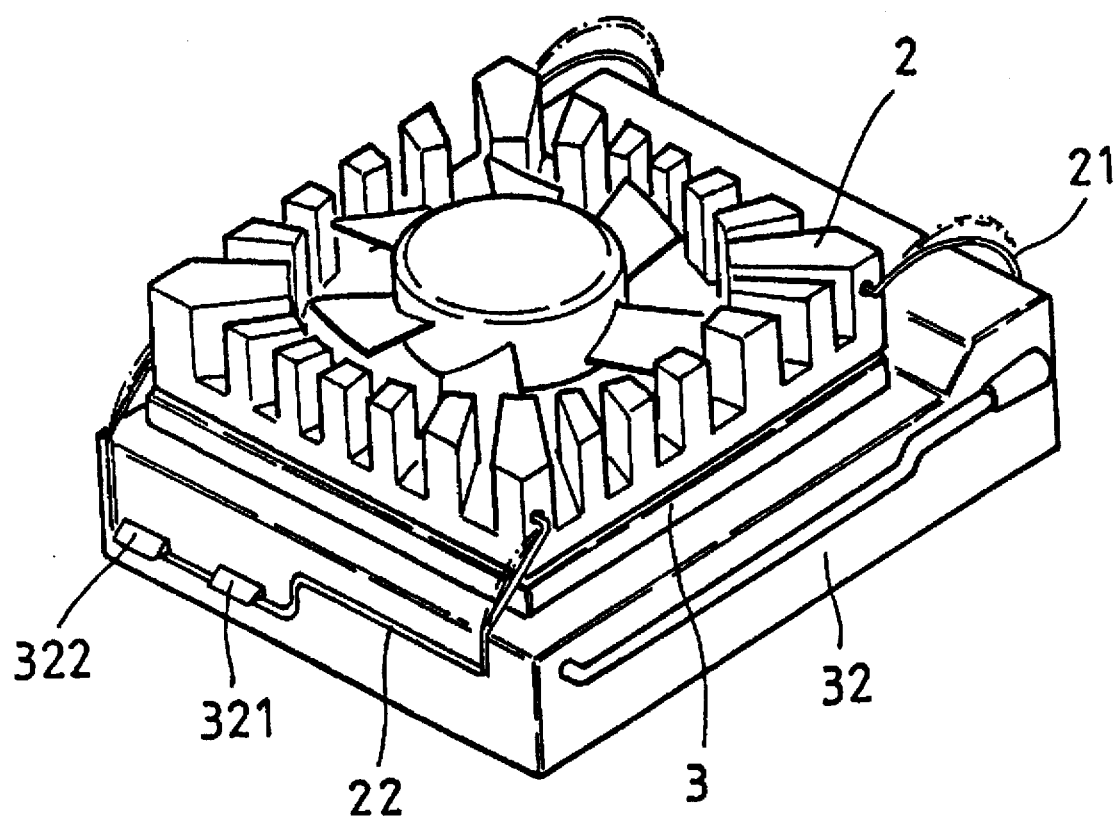
FIG. 3 is an elevational view showing the heat sink of the present invention mounted on a CPU holder having a taller height.

Referring to FIG. 2, the heat sink, referenced by 2, has two hangers 21,22 at two opposite sides. When the heat sink 2 is mounted on the CPU holder, referenced by 31, above the CPU, referenced by 3, the hangers 21,22 are hung on respective ribs 311,312 at two opposite sides of the CPU holder 31. The hangers 21,22 are respectively made from a metal wire bent into the desired shape. The ends of the hangers 21,22, as seen in FIGS. 2 and 3, are fixed into corner edges of the heat sink 2.

Because the hangers 21,22 are respectively made from a metal wire and bent into the desired shape, they can be stretched and deformed to fit the size of the CPU holder and the locations of the ribs of the CPU holder. FIG. 3 shows the hangers 21, 22 deformed and hung on the ribs 321,322 of a CPU holder 32, which has a height higher than that of the CPU holder 31 shown in FIG. 2.

Figure 4:
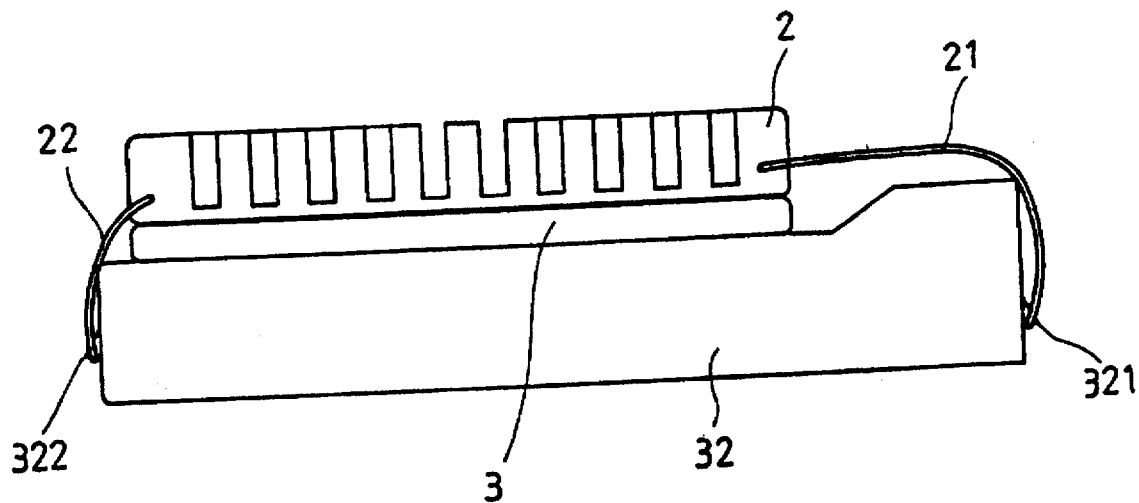
FIG. 4 is a side plain view of FIG. 3.
Figure 5:
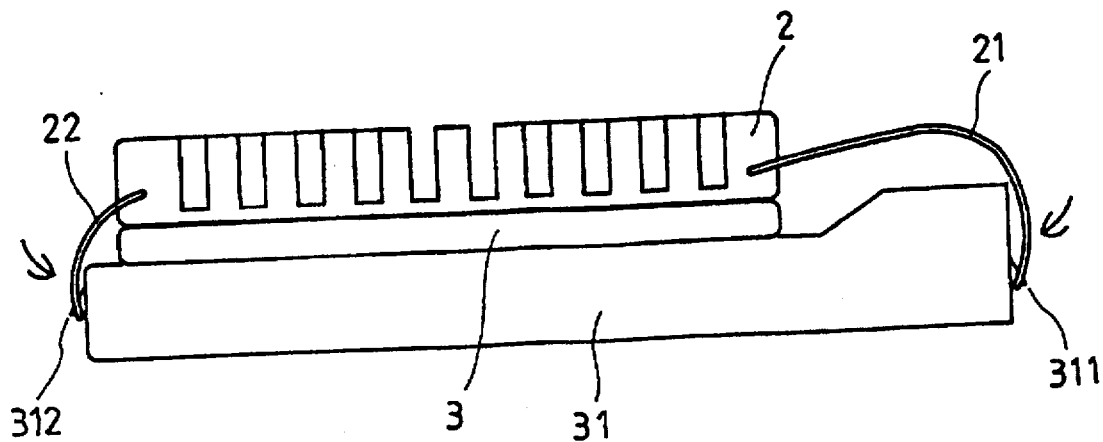
FIG. 5 is a side plain view of FIG. 4.

Referring to FIGS. 4 and 5, when the heat sink 2 is installed in the CPU holder 32 or 31, the hangers 21,22 are horizontally stretched outwards, then bent downwards over the periphery of the CPU holder 32 or 31, and then hung on the ribs 321,322; or 311,312. Therefore, the hangers 21,22 can be stretched and deformed so as to fit any of a variety of CPU holders.

It is to be understood that the drawings are designed for purposes of illustration only, and are not intended as a definition of the limits and scope of the invention disclosed.

What the invention claimed is:

1. In a heat sink for attachment to different sized CPU holders in a CPU comprising a heat sink, at least one CPU holder, and a CPU, the improvement comprising means for fixing said heat sink to one of a plurality of CPU holders, each of said CPU holders being of a different thickness;

wherein said means includes two flexible hangers fixed at opposite sides of said heat sink, said two hangers being attached to ribs on said CPU holder; and wherein said flexible hangers consist of wires bent to a desired shape and then stretched and deformed to fit onto said ribs of said CPU holder, wherein two said flexible hangers are fixed at corner edges of said heat sink, and a remaining portion of each said two flexible hangers is stretched and deformed over said ribs on said CPU holder to be held thereby.

* * * * *